(12) United States Patent
Suzuki

(10) Patent No.: US 6,472,738 B2
(45) Date of Patent: Oct. 29, 2002

(54) COMPOUND SEMICONDUCTOR DEVICE

(75) Inventor: Yoji Suzuki, Nakakoma (JP)

(73) Assignee: Fujitsu Quantum Devices Limited, Yamanashi (JP)

( * ) Notice: Subject to any disclaimer, the term of this patent is extended or adjusted under 35 U.S.C. 154(b) by 0 days.

(21) Appl. No.: 09/945,622

(22) Filed: Sep. 5, 2001

(65) Prior Publication Data
US 2002/0030267 A1 Mar. 14, 2002

(30) Foreign Application Priority Data
Sep. 8, 2000 (JP) .................................. 2000-273497

(51) Int. Cl.[7] .............................................. H01L 23/04
(52) U.S. Cl. ........................ 257/698; 257/774; 257/723; 257/691
(58) Field of Search ................................ 257/698, 659, 257/774, 723, 691

(56) References Cited
U.S. PATENT DOCUMENTS 5,404,581 A * 4/1995 Honjo .......................... 257/778
5,614,442 A * 3/1997 Tserng ......................... 257/276
5,614,743 A * 3/1997 Mochizuki ................... 257/276
5,635,762 A * 6/1997 Gamand ....................... 257/728
6,075,712 A * 6/2000 McMahon .................... 361/783

FOREIGN PATENT DOCUMENTS

| JP | 58-218130 | 12/1983 |
| JP | 8-18004 | 1/1996 |
| JP | 8-181211 | 7/1996 |
| JP | 10-92974 | 4/1998 |
| JP | 11-214448 | 8/1999 |

* cited by examiner

Primary Examiner—Jasmine J B Clark
(74) Attorney, Agent, or Firm—Armstrong, Westerman & Hattori, LLP

(57) ABSTRACT

Active elements are formed only on a first surface of a semiconductor substrate, and signal connections of the active elements are leaded to terminals formed on a second surface side of the semiconductor substrate. Accordingly, there can be provided a compound semiconductor device such as MMIC, that is capable of reducing the restriction on the arrangement of elements constituting the integrated circuit and also suppressing variation in an inductance component in the high frequency transmission system.

14 Claims, 13 Drawing Sheets

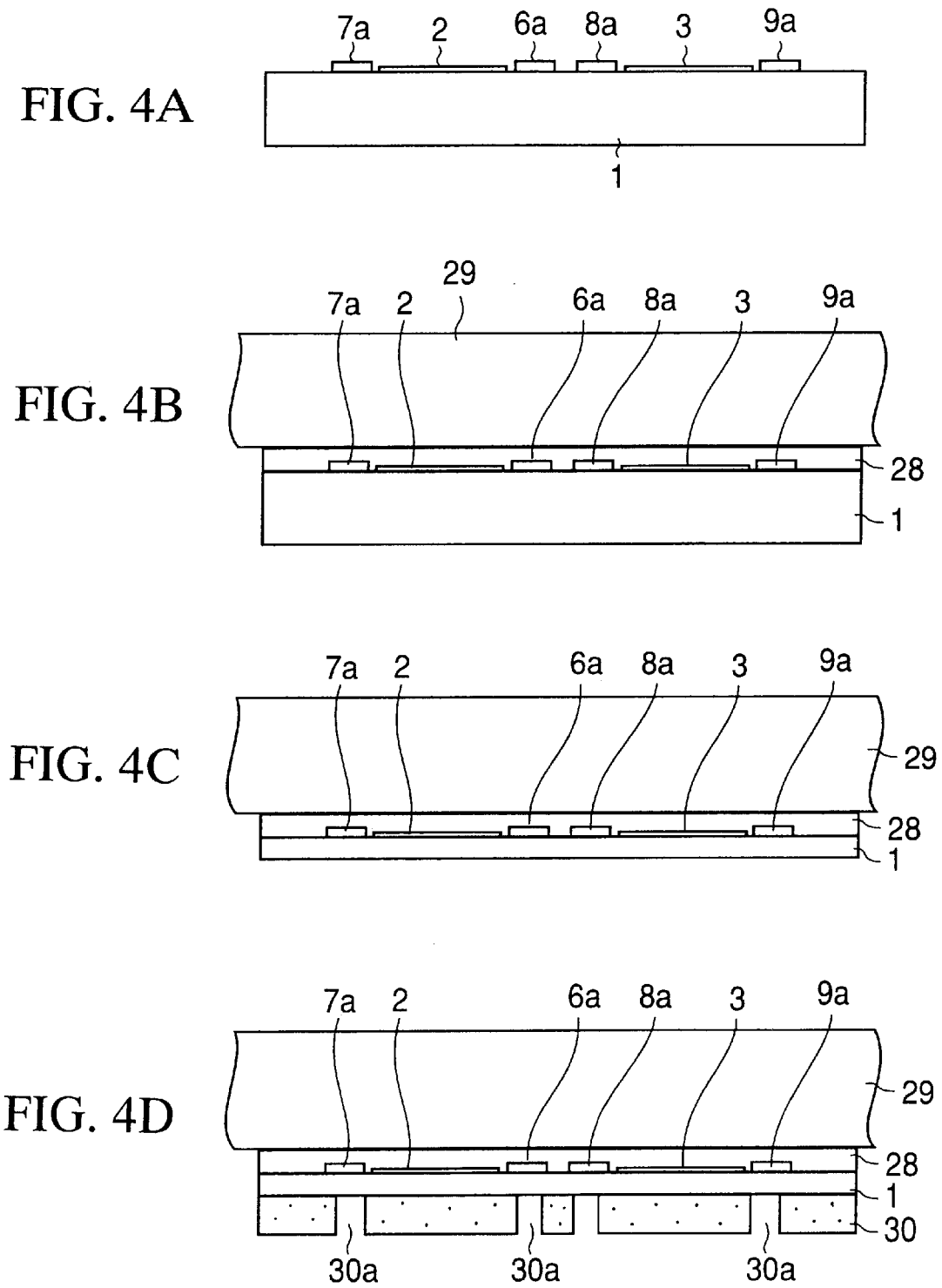

COMPOUND SEMICONDUCTOR DEVICE

BACKGROUND OF THE INVENTION

1. Field of the Invention

The present invention relates to a compound semiconductor device and, more particularly, a compound semiconductor device such as a microwave monolithic integrated circuit (MMIC), etc., the characteristics of which are largely affected by a restriction of distance.

2. Description of the Prior Art

In the communication field in recent years, the applications in the higher frequency band among the limited frequency resources are positively developed. As the semiconductor device corresponding to such applications, the MMIC using the compound semiconductor such as GaAs, etc., is employed. The MMIC is designed to overcome the restriction of distance between the elements driven with the high frequency signal by forming a plurality of elements on one substrate. As the elements constituting circuits of the MMIC, there are active elements such as HEMT, MESFET, etc., and passive elements such as a resistor, an inductor, and a capacitor, etc. These elements are connected via wirings.

The MMIC in the prior art has the structure shown in FIG. 1, for example. Also, a circuit diagram in the MMIC shown in FIG. 1 is shown in FIG. 2.

In FIG. 1, a first FET 101 and a second FET 102 are formed at a distance on a compound semiconductor substrate 100. A gate of the first FET 101 is connected to a first pad 105 via a first wiring 103 and a first capacitor 104 and also is connected a second pad 107 via a second wiring 106. The second wiring 106 has such a shape that a second capacitor 109 is connected between the second wiring 106 and a first through hole 108.

A source of the first FET 101 is connected to a second through hole 110. Also, a drain of the first FET 101 is connected to a gate of the second FET 102 via a third wiring 111 and a third capacitor 112. Also, a drain of the first FET 101 is connected to a third through hole 116 via a fourth wiring 113, a first resistor 114, and a fourth capacitor 115 and also connected to a third pad 118 via a fifth wiring 117. The fifth wiring 117 is connected to a fourth through hole 120 via a fifth capacitor 119.

A gate of the second FET 102 is connected to a fourth pad 122 via a sixth wiring 121. The sixth wiring 121 is also connected to a fifth through hole 124 via a sixth capacitor 123. A source of the second FET 102 is connected to a sixth through hole 136. A drain of the second FET 102 is connected to a fifth pad 127 via a seventh wiring 125 and a seventh capacitor 126. The drain of the second FET 102 is connected to a sixth pad 129 via an eighth wiring 128 and also connected to a seventh through hole 133 via a ninth wiring 130, a second resistor 131, and an eighth capacitor 132. The eighth wiring 128 is also connected to an eighth through hole 135 via a ninth capacitor 134.

In this case, the above first to eighth through holes are connected to a ground electrode (not shown) on a back surface of the compound semiconductor substrate 100.

As described above, the MMIC shown in FIG. 1 has such a structure that the active elements, the passive elements, the wirings, etc., are arranged on one surface of the compound semiconductor substrate and then the elements are connected to each other by wirings that are formed of a conductor such as the metal, etc. Thus, such an effect can be achieved that variation in the distance between the elements can be suppressed.

However, in the MMIC shown in FIG. 1, because the gold wire is needed in order to connect the first pad 105 and the fifth pad 127 to external peripheral circuits, the characteristic of the MMIC deteriorates by variation in the wire length.

In addition, if a design for attaining the higher performance to meet the higher frequency is attempted, such design is restricted by the arrangement of the elements. In other words, if connection lengths between respective elements become longer, a resistance component and an inductance component are increased. As a result, a new structure to meet the higher frequency demands is needed.

Based on this fact, it is desired that the connection distances between respective elements should be shortened.

In Patent Application Publication (KOKAI) Hei 8-18004, in order to shorten the connection distances between the elements, a first HEMT and a second HEMT are formed on two crystal active layers formed on both faces of an intermediate insulating layer, respectively, and the first HEMT and the second HEMT are connected through a high-concentration n-type layer buried in the holes that are formed in the crystal active layers and the intermediate insulating layer.

Also, in Patent Application Publication (KOKAI) Hei 8-181211, an SOI (Silicon-On-Insulator) substrate having a silicon oxide layer and a silicon layer is used, and an active element covered with a protection film is formed on the silicon layer, and a passive element is formed on the silicon oxide layer. A first via hole is formed in the protection film, and a second via hole connected to the first via hole is formed in the silicon oxide layer and the silicon layer. A first conductive film connected to the electrodes on the protection film is formed in the first via hole, and a second conductive film connected to the first conductive film is formed in the second via hole. The first conductive film and the second conductive film connect electrodes on the protection film to the passive elements.

In addition, in Patent Application Publication (KOKAI) Sho 58-218130 and Patent Application Publication (KOKAI) Hei 11-214448, integrated circuits are separately formed on upper and lower surfaces of a semiconductor substrate, respectively. However, there is no disclosure that these integrated circuits are connected mutually in the silicon substrate.

By the way, according to the compound semiconductor device set forth in Patent Application Publication (KOKAI) Hei 8-18004, it is difficult to connect respective active elements on both surfaces of the semiconductor substrate to the external circuits under the same conditions. Also, in case the semiconductor substrate is fitted onto the ceramic substrate, the upper active elements and the external circuits are connected via the wires. Therefore, the unevenness of the inductance component and the resistance component caused by the wire connection is inevitable.

Also, in the semiconductor device made of silicon set forth in Patent Application Publication (KOKAI) Hei 8-181211, it is normal that the external circuits are connected to the conductive pads exposed from the protection insulating film that covers the active elements. Thus, the gold wires and the bumps are employed to connect the pads and the external circuits. As a result, the variation in the inductance component accompanied by the connection of the signal system is caused in the semiconductor device.

In addition, in the semiconductor devices set forth in Patent Application Publication (KOKAI) Sho 58-218130 and Patent Application Publication (KOKAI) Hei 11-214448, mutually independent integrated circuits are formed merely on both surfaces of the semiconductor substrate. As a result, because the wire connection to the signal system of either the integrated circuit on the first surface side or the integrated circuit on the second surface side, there exists a variation in the inductance component and the resistance component accompanied by the wire connection.

SUMMARY OF THE INVENTION

It is an object of the present invention to provide a compound semiconductor device capable of reducing the restriction on the arrangement of elements constituting the integrated circuit and also suppressing the variation in an inductance component in the high frequency transmission system.

According to the present invention, the active elements are formed on a first surface of the semiconductor substrate, and the signal connection of the active elements is accomplished only by the terminals formed on a second surface of the semiconductor substrate.

Because the active element connects to the wiring pattern formed on the wiring substrate via the terminal, the wire for connecting the active element to the external circuit can be omitted. Therefore, the variations in the inductance component and the resistance component of the signal system can be suppressed.

The active elements on the first surface of the semiconductor substrate and the terminals on the second surface may be connected selectively via the contact holes, or via the inductive coupling between the coils, or via the capacitive coupling between the opposing electrodes. If the inductive coupling or the capacitive coupling is employed, it is not needed to form the holes in the semiconductor substrate and, thus, the mechanical strength of the semiconductor substrate can be maintained.

Because the bias terminals connected to the active elements are affected very little by the variation in the inductance component, they may be formed on the first surface side of the semiconductor substrate. Also, if the grounding conductive film is arranged between the input terminal and the output terminal on the second surface of the semiconductor substrate, the input signal and the output signal are shielded with the grounding conductive film.

Also, according to the present invention, the electrodes of the capacitors that are connected to the active elements are formed in the holes formed in the semiconductor substrate. Therefore, the extension of the electrodes of the capacitors from the first surface to the second surface can be executed in the thickness direction of the substrate, so that the area in circuit design can be reduced and also the margin of the circuit design can be enhanced.

BRIEF DESCRIPTION OF THE DRAWINGS

FIGS. 4A to 4L are sectional views showing steps of forming the MMIC according to the first embodiment of the present invention;

DESCRIPTION OF THE PREFERRED EMBODIMENTS

Embodiments of the present invention will be explained with reference to the accompanying drawings hereinafter.

(First Embodiment)

Figure 3A:
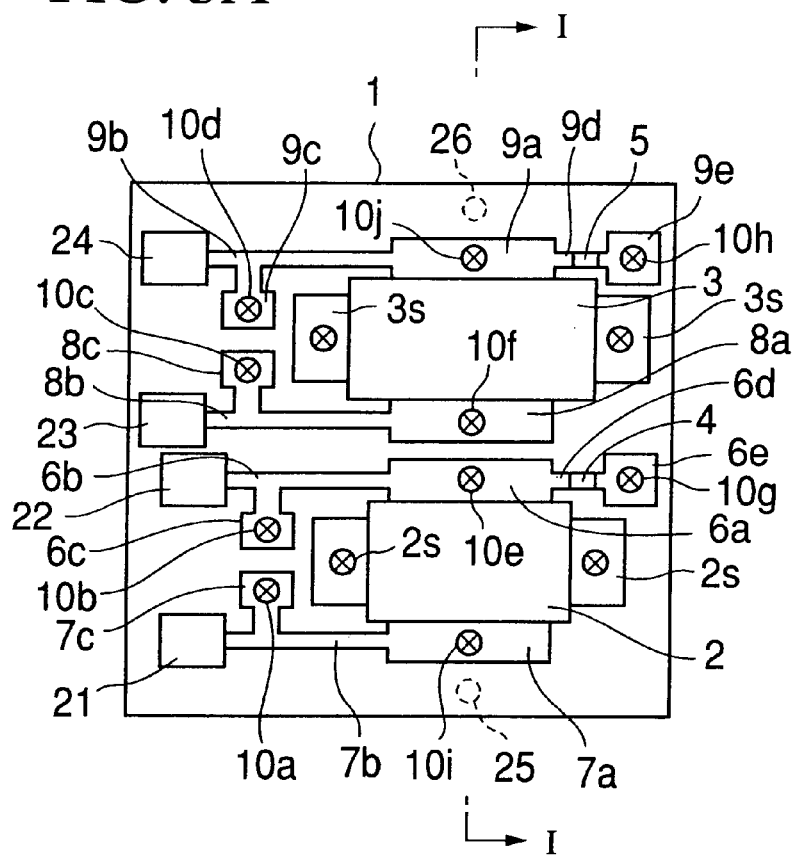
FIG. 3A is a plan view showing a first surface of the MMIC according to a first embodiment of the present invention.
Figure 3B:
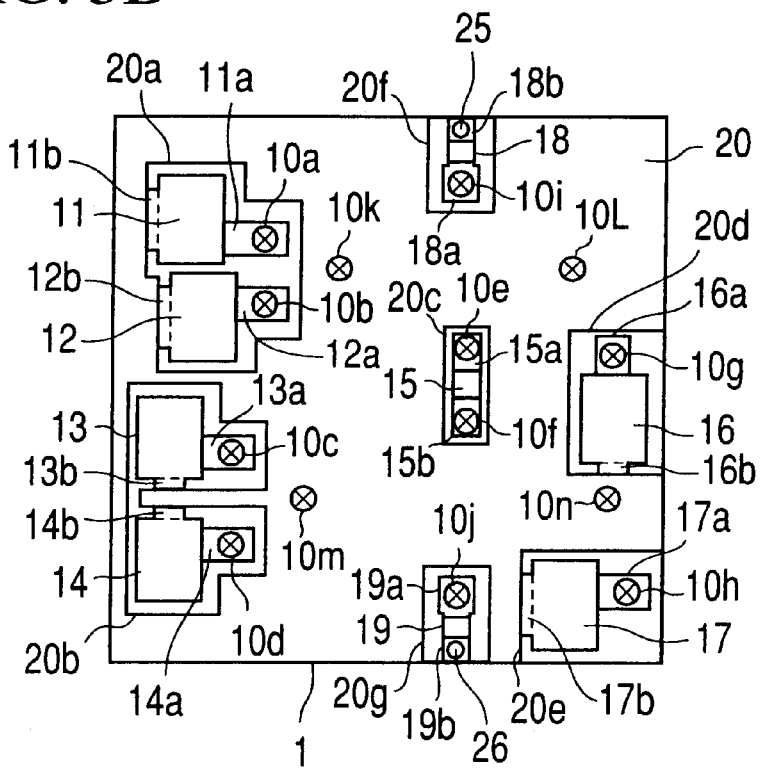
FIG. 3B is a plan view showing a second surface of the MMIC.

FIGS. 3A and 3B are a top view and a bottom view, respectively, showing the MMIC according to a first embodiment of the present invention.

First and second HEMTs (High Electron Mobility Transistors) 2, 3, first and second resistor elements 4, 5, and bias circuit system wirings are formed on a first surface (upper surface) of a semi-insulating GaAs (compound semiconductor) substrate 1 shown in FIG. 3A. In this case, the active elements such as MESFET (Metal Semiconductor FET), MISFET (Metal-Insulator-Semiconductor FET), HBT (Hetero-Bipolar Transistor), etc., maybe formed in place of the HEMT. Also, the passive elements such as first to ninth capacitors 11 to 19, an input terminal 25, an output terminal 26, contact pads, etc., are formed on a second surface (lower surface) of the GaAs substrate 1 shown in FIG. 3B, but no active element is formed thereon.

Wirings, contact pads, etc. described hereunder are connected to the first and second HEMTs 2, 3 and the first and second resistor elements 4, 5.

First, on the first surface of the GaAs substrate 1, a first drain leading electrode 6a is formed on one side portion of the first HEMT 2 positioned close to the second HEMT 3, and a first gate leading electrode 7a is formed on the other side portion. First source leading electrodes 2s are formed on front and rear end portions of the first HEMT 2. The first gate leading electrode 7a is connected to a pad-like first bias terminal 21 via a first wiring 7b. Also, a first contact pad 7c is formed on the side portion of the first wiring 7b to protrude therefrom.

The first drain leading electrode 6a is connected to a pad-like second bias terminal 22 via a second wiring 6b. Also, a second contact pad 6c is formed on the side portion of the second wiring 6b to protrude therefrom. In addition, the first drain leading electrode 6a is also connected to a third contact pad 6e via a third wiring 6d and a first resistance element 4.

Also, a second gate leading electrode 8a is formed on one side portion of the second HEMT 3 positioned close to the first HEMT 2, and a second drain leading electrode 9a is formed on the other side portion. Second source leading electrodes 3s are formed on front and rear end portions of the second HEMT 3. The second gate leading electrode 8a is connected to a pad-like third bias terminal 23 via a fourth wiring 8b. Also, a fourth contact pad 8c is formed on the side portion of the fourth wiring 8b to protrude therefrom.

The second drain leading electrode 9a is connected to a pad-like fourth bias terminal 24 via a fifth wiring 9b. Also, a fifth contact pad 9c is connected to the side portion of the fifth wiring 9b. In addition, the second drain leading electrode 9a is also connected to a sixth contact pad 9e via a sixth wiring 9d and a second resistance element 5.

Then, on the second surface of the GaAs substrate 1, first to fourth capacitors 11 to 14 are formed on back sides of the first to fourth bias terminals 21 to 24 respectively.

A first terminal 11a constituting the first capacitor 11 is pulled out to the back side of the first contact pad 7c, and then connected to the first contact pad 7c via a first hole 10a formed in the GaAs substrate 1. The same is true of the second to fourth capacitors 12 to 14. That is, first terminals 12a, 13a, 14a of the second to fourth capacitors 12 to 14 are pulled out to the back side of the second, fourth, and fifth contact pads 6c, 8c, 9c respectively, and then connected to the second, fourth, and fifth contact pads 6c, 8c, 9c via second to fourth holes 10b to 10d formed in the GaAs substrate 1.

A fifth capacitor 15 is formed on the back side of the area between the first drain leading electrode 6a and the second gate leading electrode 8a. A first electrode 15a of the fifth capacitor 15 is pulled out to the back side of the first drain leading electrode 6a, and then connected to the first drain leading electrode 6a via a fifth hole 10e. Also, a second electrode 15b of the fifth capacitor 15 is pulled out to the back side of the second gate leading electrode 8a, and then electrically connected to the second gate leading electrode 8a via a sixth hole 10f.

In addition, sixth and seventh capacitors 16, 17 are formed on the second surface of the GaAs substrate 1. A first electrode 16a of the sixth capacitor 16 is connected to the third contact pad 6e on the first surface side via a seventh hole log. Also, a first electrode 17a of the seventh capacitor 17 is connected to the sixth contact pad 9e on the first surface side via an eighth hole 10h.

Further, eighth and ninth capacitors 18, 19 are formed on the second surface of the GaAs substrate 1. A first electrode 18a of the eighth capacitor 18 is connected to the first gate leading electrode 7a on the first surface side via a ninth hole 10i. Also, a first electrode 19a of the ninth capacitor 19 is connected to the second drain leading electrode 9a on the first surface side via a tenth hole 10j.

A grounding metal film 20 used also as a heat sink is formed on the second surface of the GaAs substrate 1. The grounding metal film 20 has windows 20a to 20g that expose the first to ninth capacitors 11 to 19, their first electrodes 11a to 19a, and the second electrode 15b of the fifth capacitor 15. The grounding metal film 20 is electrically connected to the first and second source leading electrodes 2s, 3s via eleventh to fourteenth holes 10k to 10n. Also, second electrodes 11b, 12b, 13b, 14b of the first to fourth capacitors 11 to 14 are extended to edges of the surrounding windows 20a, 20b and then connected to the grounding metal film 20. Similarly, second electrodes 16b, 17b of the sixth and seventh capacitors 16, 17 are also connected to the grounding metal film 20.

A second electrode 18b of the eighth capacitor 18 is positioned closely to the periphery of the GaAs substrate 1 not to contact to the grounding metal film 20. A high frequency input terminal 25 made of cylindrical conductive metal (pillar) is formed on the second electrode 18b. Also, a second electrode 19b of the ninth capacitor 19 is positioned closely to the periphery of the GaAs substrate 1 not to contact to the grounding metal film 20. A high frequency output terminal 26 made of cylindrical conductive metal is formed on the second electrode 19b. In this case, on the second surface of the GaAs substrate 1, the high frequency input terminal 25 and the high frequency output terminal 26 are shielded with the grounding metal film 20 formed between them.

The high frequency input terminal 25 and the high frequency output terminal 26 are formed of a metal film having the same structure as the grounding metal film 20. The metal film is formed thickly by the plating method, or the like.

The first to ninth capacitors 11 to 19 have dielectric films that are put between the first electrodes 11a to 19a and the second electrodes b to 19b, although not shown in FIGS. 3A and 3B.

The source leading electrodes 2s, 3s and the drain leading electrodes 6a, 9a are formed of a gold layer, gold-germanium/nickel-gold layers, titanium/platinum/gold layers, or the like respectively. The gate leading electrodes 7a, 8a are formed of metal material such as tungsten, tungsten silicide, tungsten silicide nitride, etc. The first and fourth wirings 7b, 8b are formed by the same layer as the gate leading electrodes 7a, 8a. The second, third, fifth and sixth wirings 6b, 6d, 9b, 9d are formed by the same layer as the drain leading electrodes 6a, 9a. Also, the first to fourth bias terminals 21 to 24 are formed by the same layer as the drain leading electrodes 6a, 9a.

Figure 1:
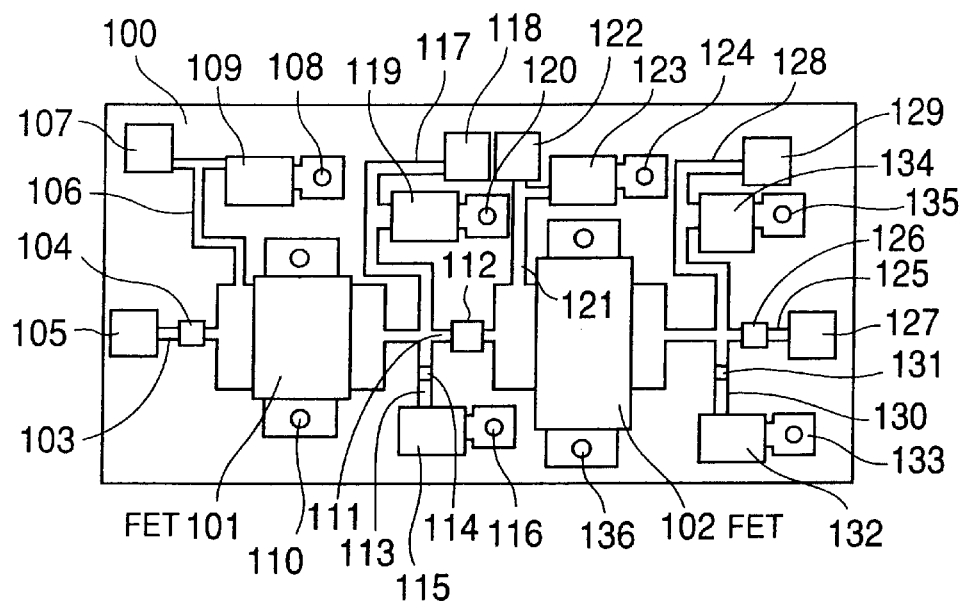
FIG. 1 is a plan view showing the MMIC in the prior art.
Figure 2:
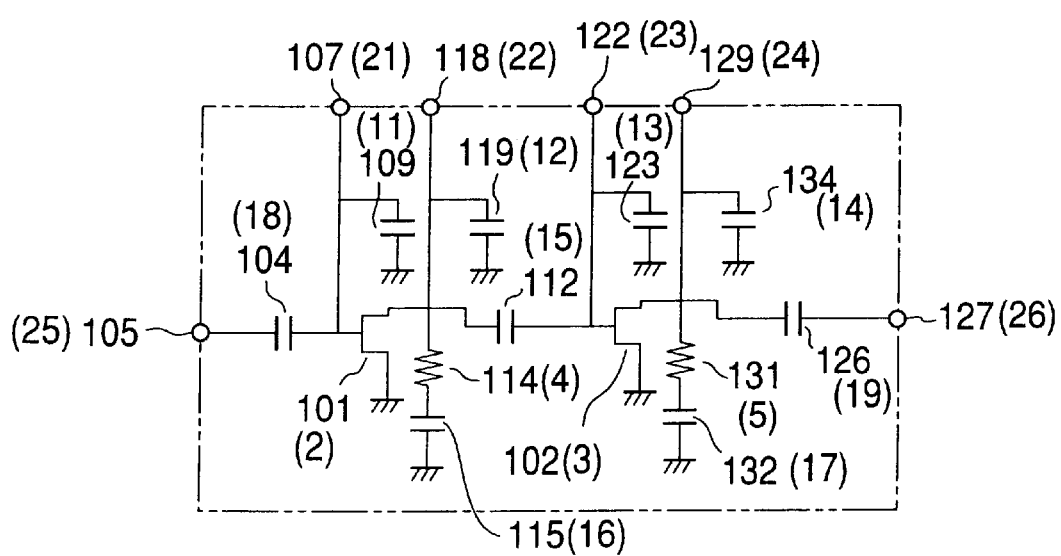
FIG. 2 is a first circuit diagram in the MMIC in FIG. 1.

An equivalent circuit of the MMIC having the above configuration is shown in FIG. 2. That is, the MMIC of the first embodiment has the same circuit configuration as the MMIC shown in FIG. 1 in the prior art, nevertheless a chip size of the MMIC can be reduced. In addition, because the active elements are formed on the first surface of the GaAs substrate 1, the passive elements are formed on the second surface, and the active elements on the first surface side and the passive elements on the second surface side are connected via the holes, design restrictions on the area and the distance can be reduced.

In addition, the capacitor 15 connected between the first drain leading electrode 6a of the first HEMT 2 and the second gate leading electrode 8a of the second HEMT 3 is formed on the second surface. Therefore, the distance between the first drain leading electrode 6a and the second gate leading electrode 8a can be reduced more than in the prior art, and thus the distance between the first HEMT 2 and the second HEMT 3 can be shortened.

Also, the high frequency transmission line is formed on the second surface of the GaAs substrate 1. In other words, the high frequency input terminal 25 and the high frequency output terminal 26 are formed as the pillar conductive metal on the second surface. Therefore, the high frequency input terminal 25 and the high frequency output terminal 26 can be connected directly to the wiring patterns on the ceramic substrate (not shown) via the solder, for example.

In contrast, because the bias voltage supply is not so affected by the variation in the wiring distances, the problem does not particularly occur even if the first to fourth bias terminals 21 to 24 formed on the first surface side of the GaAs substrate 1 are connected to the external power supply (not shown) via the wires. Also, the grounding metal film 20 is connected to the ground wiring on the ceramic substrate.

Also, the grounding metal film 20 is connected to the ground wiring on the ceramic substrate.

In addition, the grounding metal film 20 is formed in the area of the second surface of the GaAs substrate 1 other than the capacitors 11 to 19, the high frequency input terminal 25 and the high frequency output terminal 26, and their peripheral areas. Therefore, since the grounding metal film 20 acts as the heat sink, it has the large radiating effect such that the heat generated in the channel portions of the first and second HEMTs 2, 3 can escape to the outside via the GaAs substrate 1 and the grounding metal film 20.

The steps of manufacturing the MMIC, viewed from a cross section taken along a I—I line in FIG. 3A, will be explained with reference to FIGS. 4A to 4L. In FIGS. 4A to 4L, the first and second gate leading electrodes 7a, 8a and the first and second drain leading electrodes 6a, 9a are depicted separately from the first and second HEMTs 2, 3 to simplify their arrangement. Actually, the first and second gate leading electrodes 7a, 8a are connected to the gate electrodes (not shown) of the first and second HEMTs 2, 3, and the first and second drain leading electrodes 6a, 9a are connected to the drain electrodes (not shown) of the first and second HEMTs 2, 3.

First, the first and second HEMTs 2, 3 shown in FIG. 3A, the first and second gate leading electrodes 7a, 8a, the first and second source leading electrodes 2s, 3s, and the first and second drain leading electrodes 6a, 9a, all connected to the HEMTs, the first to sixth wirings 7b, 6b, 6d, 8b, 9b, 9d of the bias circuit system, etc. are formed on the first surface of the GaAs substrate 1. A thickness of the GaAs substrate 1 is about 0.6 mm at this stage. The active layers such as the channel layers of the first and second HEMTs 2, 3, etc. may be formed by either the epitaxial growth method or the ion implantation method. The sectional shape is shown in FIG. 4A.

Then, as shown in FIG. 4B, an adhesive agent 28 is coated on the GaAs substrate 1 to cover the first and second HEMTs 2, 3, etc. Then, the GaAs substrate 1 is adhered to a supporting substrate 29, e.g., a glass substrate via the adhesive agent 28. The UV curing adhesive agent may be employed as the adhesive agent 28. Also, the wax may be employed in place of the adhesive agent 28.

Then, as shown in FIG. 4C, the GaAs substrate 1 is thinned up to a thickness of about 20 to 100 μm by polishing or etching the second surface side.

Then, as shown in FIG. 4D, resist 30 is coated on the second surface of the GaAs substrate 1, and then windows 30a are formed on the back sides of the first and second gate leading electrodes 7a, 8a and the first and second drain leading electrodes 6a, 9a by exposing/developing the resist 30. In this case, although not shown in FIG. 4D, the windows (not shown) are formed on the back sides of the first and second source leading electrodes 2s, 3s, and the first to sixth contact pads 7c, 6c, 6e, 8c, 9c, 9e.

Figure 4E:
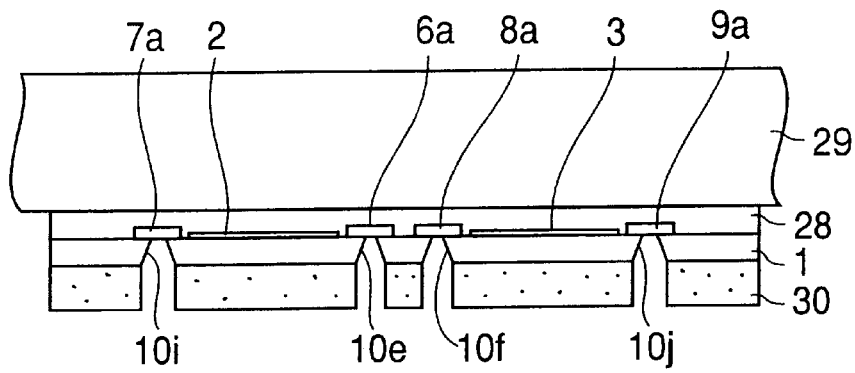

In turn, the first to fourteenth holes 10a to 10n are formed by etching the GaAs substrate 1 via the windows 30a in the resist 30. FIG. 4E shows the fifth, sixth, ninth, and tenth holes 10e, 10f, 10i, 10j formed under the first and second gate leading electrodes 7a, 8a and the first and second drain leading electrodes 6a, 9a.

Figure 4F:
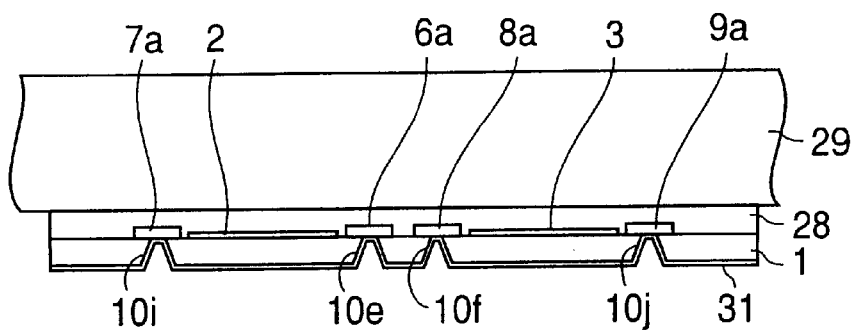
Figure 4G:
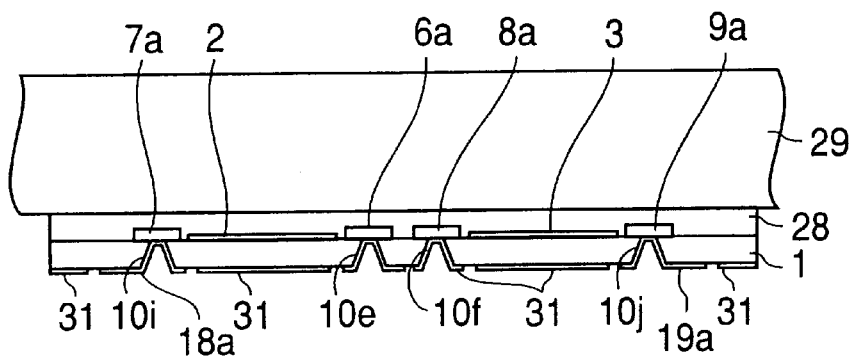

Then, the resist 30 is removed. Then, as shown in FIG. 4F, a first metal layer 31 formed of a gold (Au) layer, titanium/tantalum layers, a nickel-chromium, or the like is formed on the second surface of the GaAs substrate 1 and in the holes 10a to 10n by the sputter method. Then, as shown in FIG. 4G, first electrodes 11a to 19a for the capacitors, that exist in the first to fifth holes 10a to 10e, and the seventh to tenth holes 10g to 10j, by patterning the first metal layer 31 by virtue of the photolithography method. The first metal layer 31 is left isolatedly in the sixth hole 10f and the eleventh to fourteenth holes 10k to 10n, and on their peripheral areas, the ground area, and the input and output terminal areas respectively.

Figure 4H:
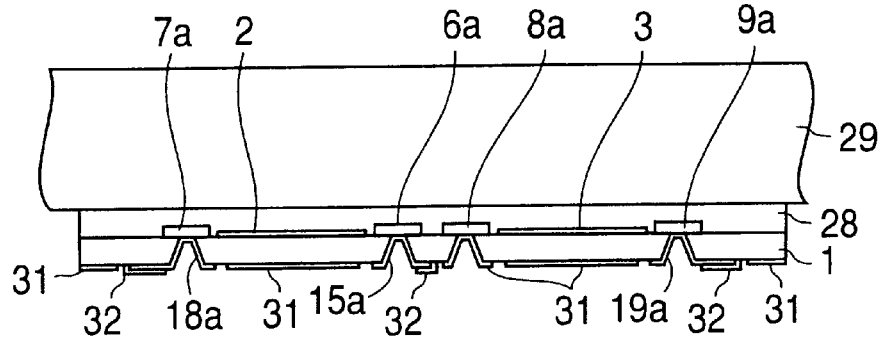

Then, a dielectric layer 32 made of silicon nitride is formed on the second surface of the GaAs substrate 1, the first metal layer 31, and the first electrodes 11a to 19a. Then, as shown in FIG. 4H, the dielectric layer 32 is patterned by the photolithography method to be left on the first electrodes 11a to 19a except the holes 10a to 10e, 10g to 10j.

Figure 4I:
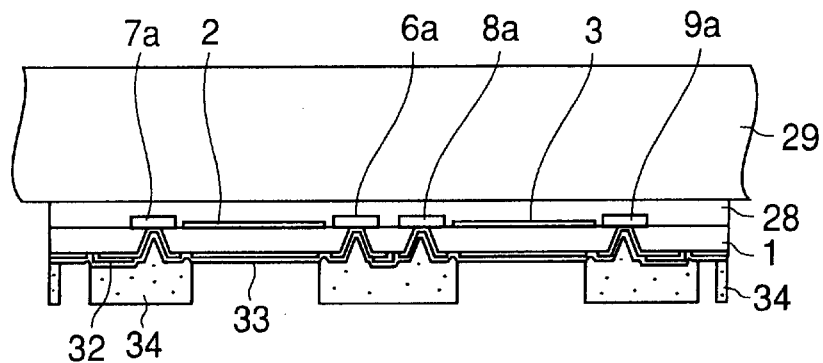

Then, as shown in FIG. 4I, a second metal film 33 made of Au is formed on the second surface of the GaAs substrate 1 to cover the first metal layer 31 and the dielectric layer 32. Then, resist 34 is coated on the second metal film 33, and then the resist 34 is exposed/developed to be left on the capacitor areas and their peripheral areas, the peripheral area of the input terminal area, and the peripheral area of the output terminal area.

Figure 4J:
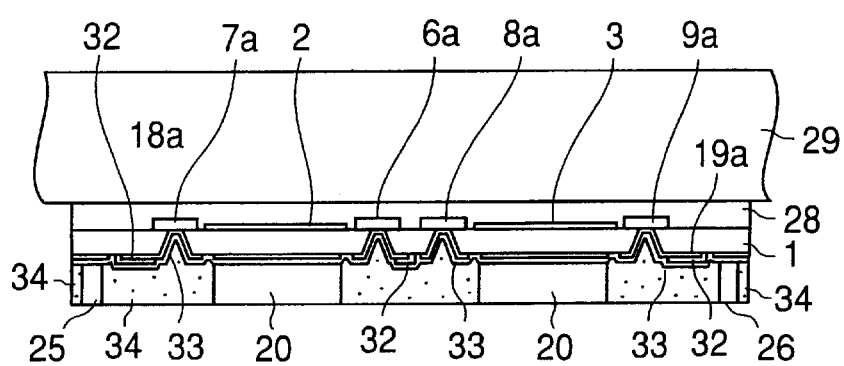

Then, a gold layer of about several tens μm thickness is formed on the portion of the second metal film 33, that is not covered with the resist 34, by the electrolytic plating method while using the second metal film 33 as the electrode. Accordingly, as shown in FIG. 4J, on the second surface of the GaAs substrate 1, the grounding metal film 20 that is connected electrically to the first and second source leading electrodes 2s, 3s of the first and second HEMTs 2, 3 via the eleventh to fourteenth holes 10k to 10n is formed and also the high frequency input terminal 25 and the high frequency output terminal 26 as the conductive pillar are formed.

Figure 4K:
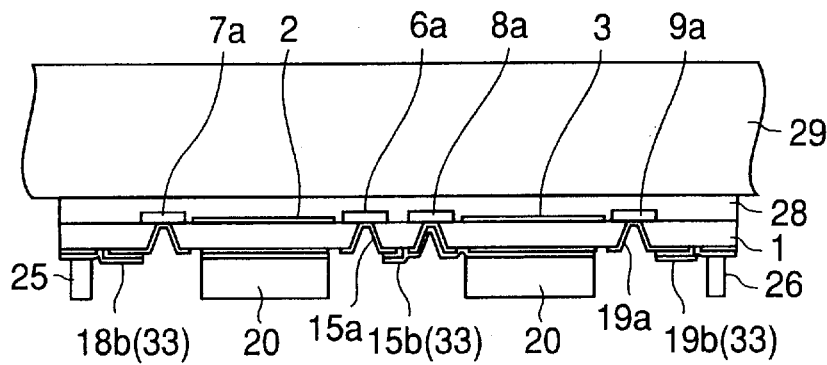

Then, the resist 34 is removed. Then, as shown in FIG. 4K, the second metal film 33 is patterned by the photolithography method to form the second electrodes 11b to 19b of the first to ninth capacitors 11 to 19. More particularly, the second electrodes 11b to 14b of the first to fourth capacitors 11 to 14 and the second electrodes 16b, 17b of the sixth and seventh capacitors 16, 17 are present under the grounding metal film 20 as they are, the second electrode 18b of the eighth capacitor 18 is extended under the high frequency input terminal 25 as it is, the second electrode 15b of the fifth capacitor 15 is connected to the second gate leading electrode 8a of the second HEMT 3 via the first metal film 31 and the sixth hole 10f, and the second electrode 19b of the ninth capacitor 19 is extended under the high frequency output terminal 26 as it is.

In this case, the grounding metal film 20 is connected to the first and second source leading electrodes 2s, 3s of the first and second HEMTs 2, 3 via the first metal film 31 and the eleventh to fourteenth holes 10k to 10n.

Figure 4L:
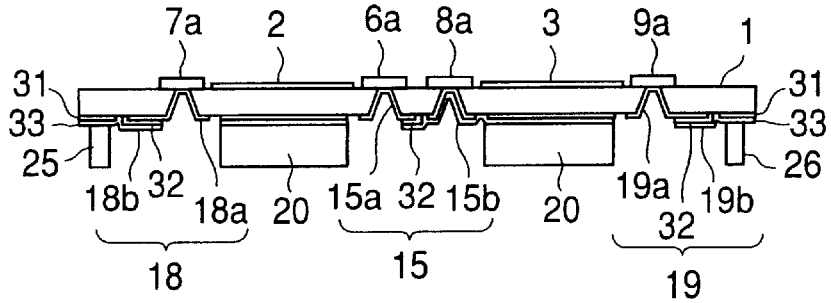

After this, as shown in FIG. 4L, when the adhesive agent 28 is removed with the solvent, the supporting substrate 29 is easily released from the GaAs substrate 1.

According to above steps, the formation of the MMIC shown in FIGS. 3A and 3B is completed.

(Second Embodiment)

In a second embodiment, the MMIC having the structure that all the active elements and the passive elements are provided on the first surface of the compound semiconductor substrate and also bias power supply connections and input/output terminal connections are provided on the second surface will be explained hereunder.

Figure 5A:
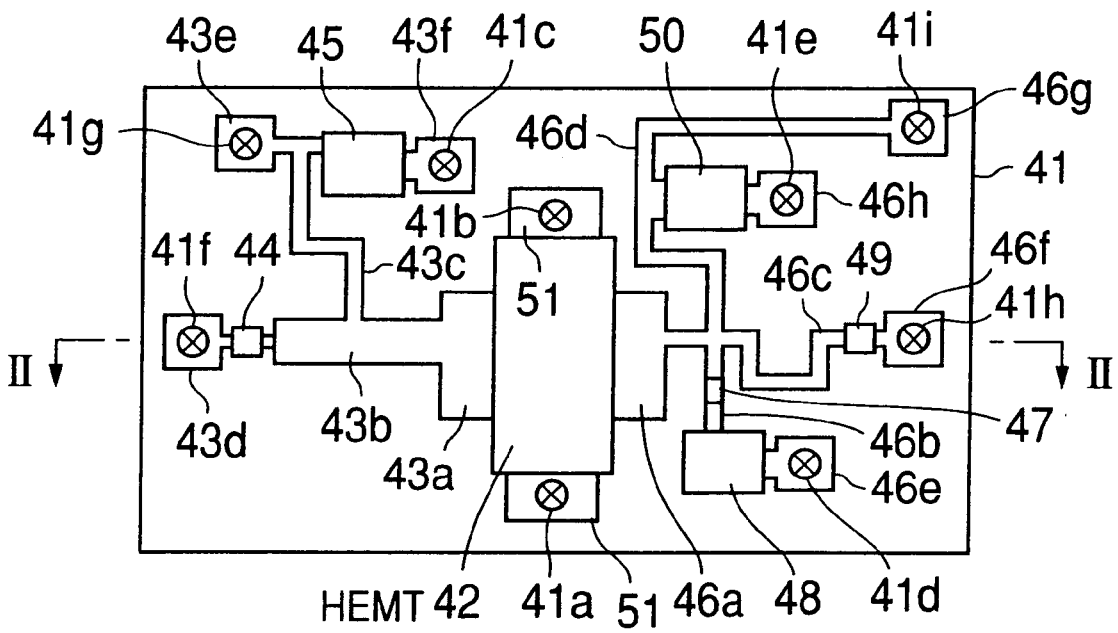
FIG. 5A is a plan view showing a first surface of the MMIC according to a second embodiment of the present invention.
Figure 5B:
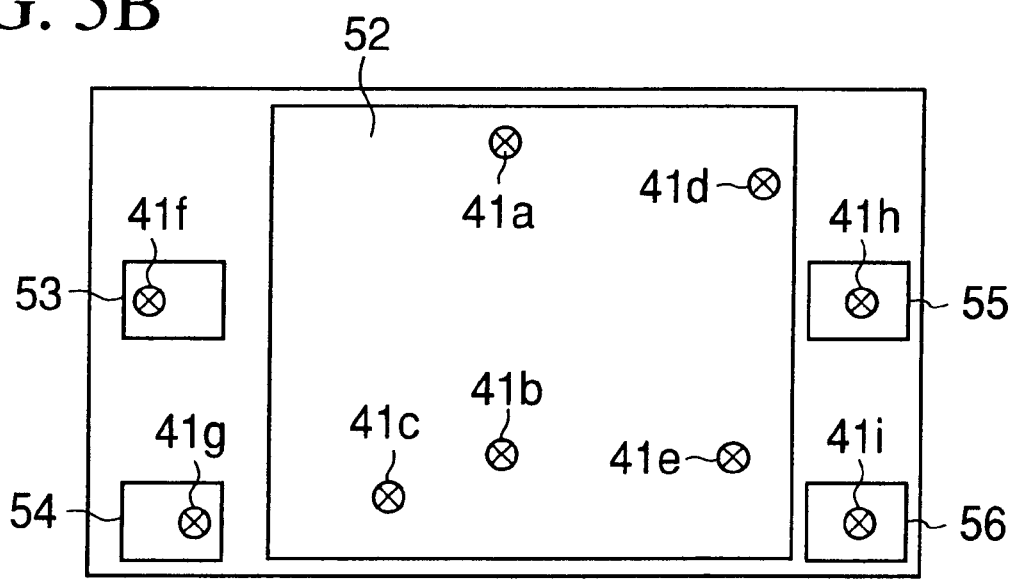
FIG. 5B is a plan view showing a second surface of the MMIC.

FIGS. 5A and 5B are plan views showing a first surface and a second surface of the MMIC according to the second embodiment of the present invention respectively.

A HEMT 42 is formed in the center of the first surface of a semi-insulating GaAs (compound semiconductor) substrate 41 shown in FIG. 5A. The active element such as MESFET, MISFET, HBT, or the like may be formed instead of the HEMT. Also, the active element and the passive element are not formed on the second surface (lower surface) of the GaAs substrate 41 shown in FIG. 5B.

A gate leading electrode 43a is formed on one side of the HEMT 42, and a first wiring 43b and a second wiring 43c are connected to the gate leading electrode 43a. A first electrode of a first capacitor 44 is connected to a top end of the first wiring 43b. A second electrode of the first capacitor 44 is connected to a first contact pad 43d. Also, a top end of the second wiring 43c is separated into two portions. A second contact pad 43e is connected to one portion and a first electrode of a second capacitor 45 is connected to the other portion. A second electrode of a second capacitor 45 is connected to a third contact pad 43f.

A drain leading electrode 46a is formed on the other side of the HEMT 42, and third to fifth wirings 46b to 46d are connected to the drain leading electrode 46a. A resistance element 47 is connected in series in the middle of the third wiring 46b, and a first electrode of a third capacitor 48 is connected to a top end of the third wiring 46b. A fourth contact pad 46e is connected to a second electrode of a third capacitor 48. Also, a first electrode of a fourth capacitor 49 is connected to a top end of the fourth wiring 46c, and a second electrode of the fourth capacitor 49 is connected to a fifth contact pad 46f. A top end of a fifth wiring 46d is connected to a sixth contact pad 46g, and also a first electrode of a fifth capacitor 50 is connected to the side portion of a fifth wiring 46d. Also, a second electrode of the fifth capacitor 50 is connected to a seventh contact pad 46h.

Source leading electrodes 51 are formed at front and rear end portions of the HEMT 42 respectively.

A grounding metal film 52 is formed in the center of the second surface of the GaAs substrate 41 shown in FIG. 5B. The grounding metal film 52 is connected to a source leading electrode 51 and third, fourth and seventh contact pads 43f, 46e, 46h positioned on the first surface side via first to fifth holes 41a to 41e respectively.

Also, a high frequency input terminal 53 that is connected to the first contact pad 43d on the first surface side via a sixth contact hole 41f, a first bias terminal 54 that is connected to the second contact pad 43e on the first surface side via a seventh hole 41g, a high frequency output terminal 55 that is connected to the fifth contact pad 46f on the first surface side via an eighth contact hole 41h, and a second bias terminal 56 that is connected to the sixth contact pad 46g on the first surface side via a ninth contact hole 41i are formed on the second surface of the GaAs substrate 41. In this case, on the second surface of the GaAs substrate 41, the high frequency input terminal 53 and the high frequency output terminal 55 are shielded with the grounding metal film 52 formed between them.

Figure 6:
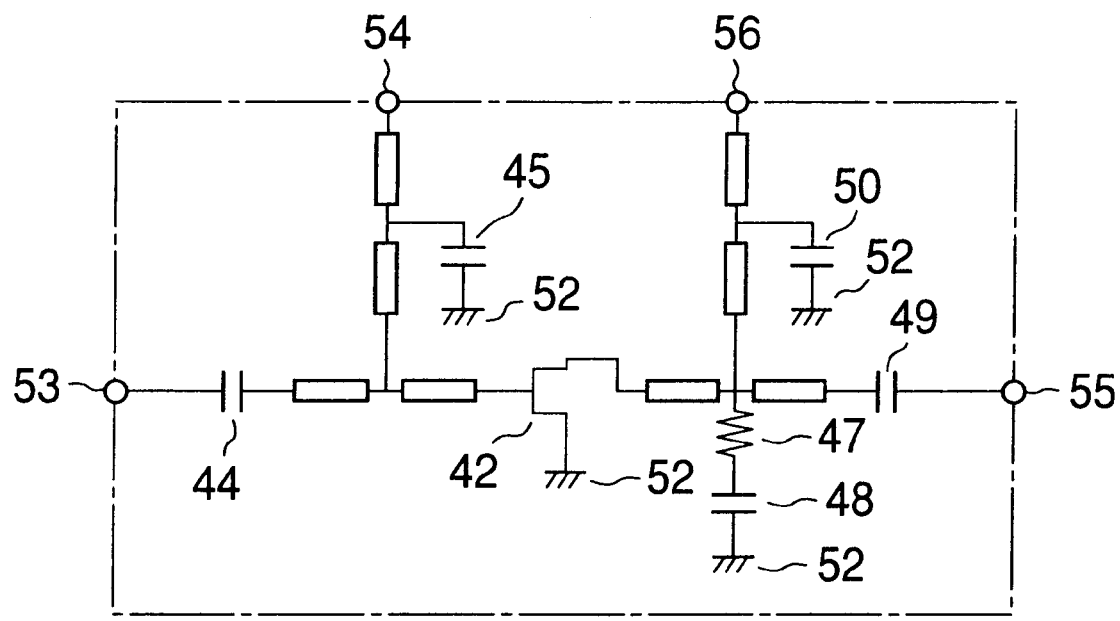
FIG. 6 is a second circuit diagram in the MMIC.

A circuit diagram of the MMIC shown in FIGS. 5A and 5B is shown in FIG. 6. Since the first to fifth wirings 43b, 43c, 46b to 46d are longer than those in the first embodiment, the inductance component is present in FIG. 6.

In the above MMIC, all the functional circuits consisting of the active elements and the passive elements are mounted on the first surface side of the GaAs substrate 41, and merely the bias terminals 54, 56, the high frequency input terminal 53, and the high frequency output terminal 55 are provided on the second surface side. As a result, the connection from the first surface of the GaAs substrate 41 to the external devices can be omitted, and thus the first surface on which important circuits are present can be covered perfectly with the silicon oxide film.

Also, since the MMIC has the structure which can be connected to the external devices only via the second surface, such structure makes it possible to measure characteristics of the functional circuits in the middle of the formation of the bias terminals 54, 56, the high frequency input terminal 53, and the high frequency output terminal 55 on the second surface or immediately before the formation of them is completed.

The above MMIC is mounted on the ceramic substrate (not shown), for example. Then, the high frequency input terminal 53 and the high frequency output terminal 55 are connected to signal wirings on the ceramic substrate via the solder, for example, respectively and also the bias terminals 54, 56 are connected to bias wirings on the ceramic substrate. Also, the grounding metal film 52 is connected to the ground wiring on the ceramic substrate.

The steps of manufacturing the MMIC, viewed from a cross section taken along a II—II line in FIG. 5A, will be explained with reference to FIGS. 7A to 7K hereunder. In FIGS. 7A to 7K, the gate leading electrode 43a and the drain leading electrode 46a are depicted separately from the HEMT 42 to make easy the understanding of their arrangement. Actually, the gate leading electrode 43a is connected to the gate electrode (not shown) of the HEMT 42 and the drain leading electrode 46a is connected to the drain electrode (not shown) of the HEMT 42.

First, the HEMT 42 shown in FIG. 5A, the gate leading electrode 43a, the drain leading electrode 46a, and the source leading electrode 51, all connected to the HEMT 42, the first to fifth capacitors 44, 45, 48 to 50, the resistance element 47, the wirings 43b, 43c, 46b to 46d, etc. are formed on the first surface of the GaAs substrate 41. The active layers such as the channel layers of the HEMT 42, etc. may be formed by either the epitaxial growth method or the ion implantation method. The sectional shape is shown in FIG. 7A.

Figure 7A:
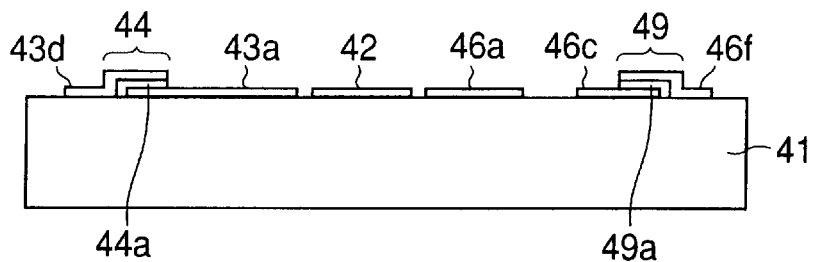
FIGS. 7A to 7K are sectional views showing steps of forming the MMIC according to the second embodiment of the present invention.

In FIG. 7A, the first electrode of the first capacitor 44 is formed of a metal film constituting the first wiring 43 and the second electrode is formed of a metal film constituting the first contact pad 43d. Then, a dielectric film 44a made of silicon nitride is formed between the first electrode and the second electrode of the first capacitor 44. Also, the first electrode of the fourth capacitor 49 is formed of a metal film constituting the fourth wiring 46c and the second electrode is formed of a metal film constituting the fifth contact pad 46f. Then, a dielectric film 49a made of silicon nitride is formed between the first electrode and the second electrode of the fourth capacitor 49.

Figure 7B:
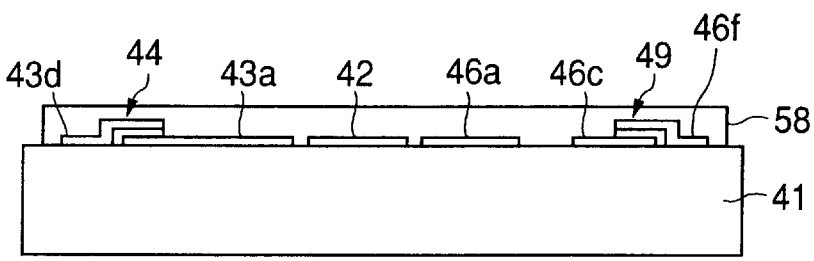

Then, as shown in FIG. 7B, a surface protection film 58 made of insulating material such as silicon oxide, silicon nitride, polyimide, BCB (benzocyclobutyne), or their combination, or the like is formed on the first surface of the GaAs substrate 41 to cover the HEMT 42, the resistance element 47, the capacitors 44, 45, 48 to 50, etc. The surface protection film 58 is formed to improve the moisture resistance and the scratch protection of the HEMT 42, the resistance element 47, the capacitors 44, 45, 48 to 50, etc.

Figure 7C:
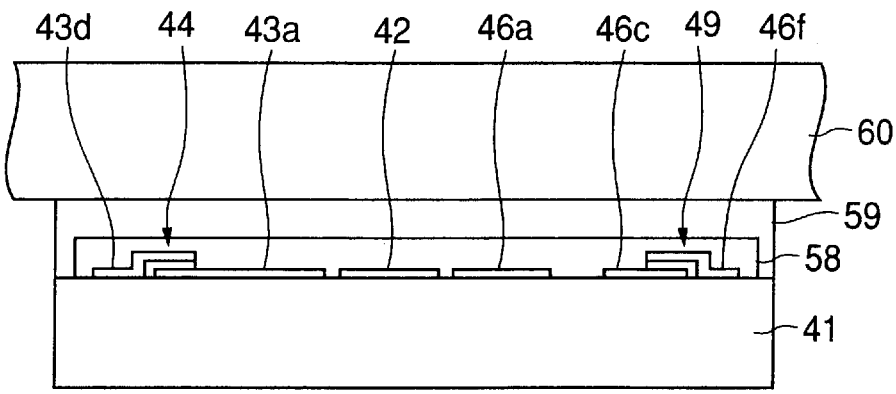

Then, as shown in FIG. 7C, an adhesive agent 59 is coated on the surface protection film 58 and the GaAs substrate 41. Then, the GaAs substrate 41 is adhered in parallel with a supporting substrate 60 via the adhesive agent 59. A UV curing adhesive agent may be employed as the adhesive agent 59. Also, the wax may be employed instead of the adhesive agent 59.

Figure 7D:
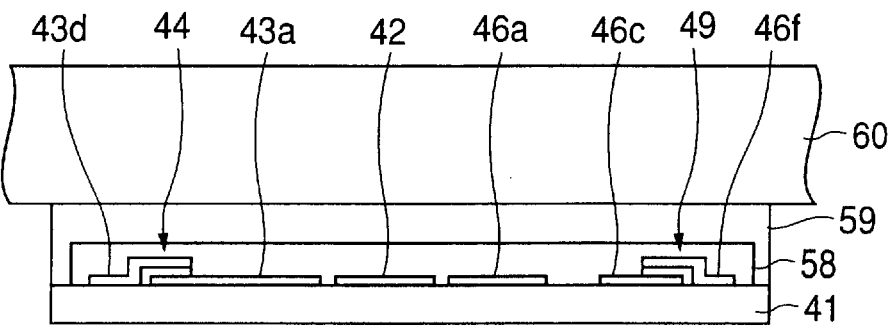

Then, as shown in FIG. 7D, the GaAs substrate 41 is thinned up to a thickness of about 20 to 100 μm by polishing or etching the second surface side of the GaAs substrate 41.

Figure 7E:
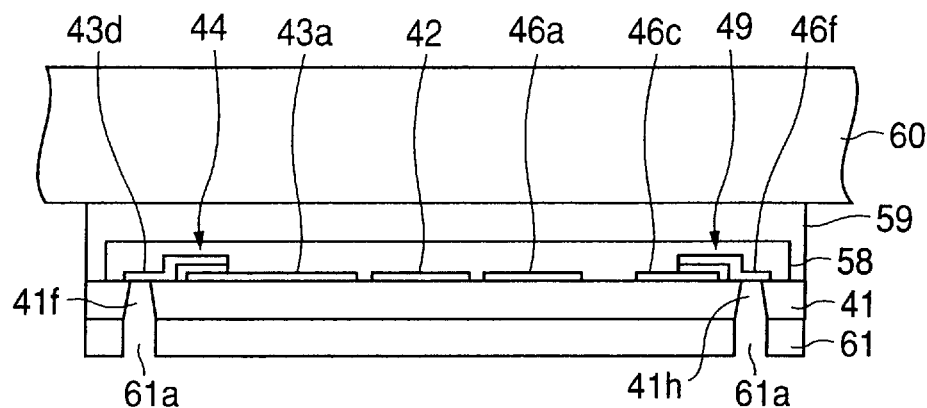

Then, as shown in FIG. 7E, resist 61 is coated on the second surface of the GaAs substrate 41, and then windows 61a are formed on the back side of the first contact pad 43d and the fifth contact pad 46f by exposing/developing the resist 61. In this case, although not shown in FIG. 7E, windows (not shown) are also formed on the back side of the gate leading electrode 43a, the drain leading electrode 46a, the source leading electrodes 51, the second to fourth, sixth and seventh contact pads 43e, 43f, 46e, 46g, 46h.

Then, the first to ninth holes 41a to 41i are formed by etching the GaAs substrate 41 via the window 61a of the resist 61.

Figure 7F:
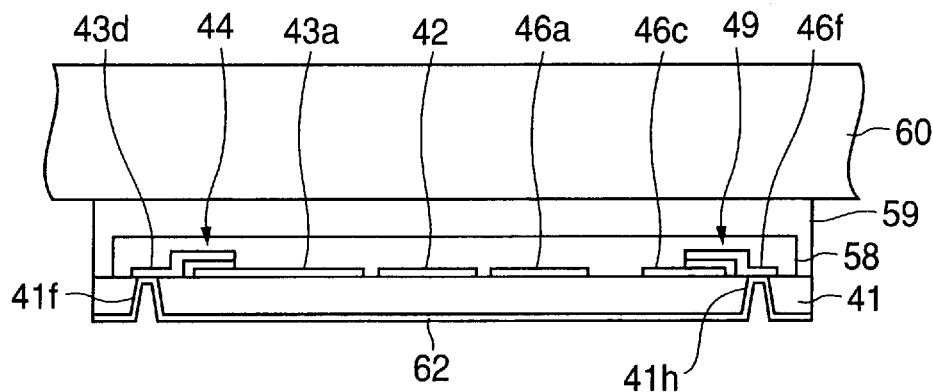

Then, the resist 61 is removed. Then, as shown in FIG. 7F, a gold (Au) film 62 of about 400 nm thickness is formed on the second surface of the GaAs substrate 41 and in the first to seventh holes 41a to 41i by the sputter method.

Figure 7G:
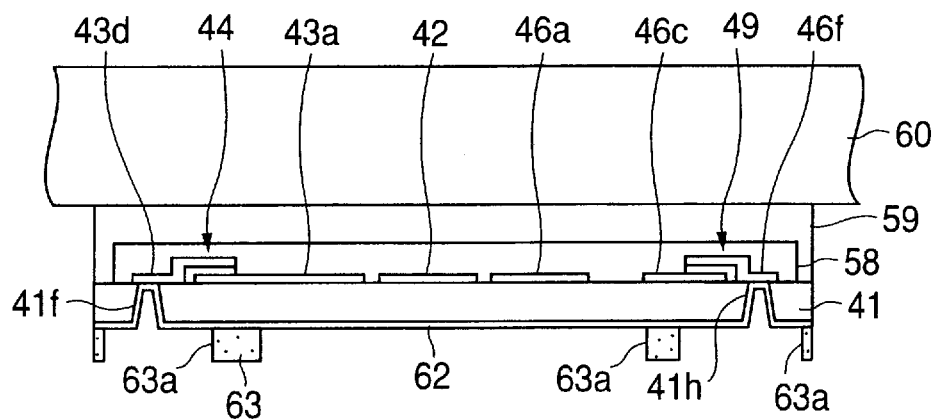
Figure 7H:
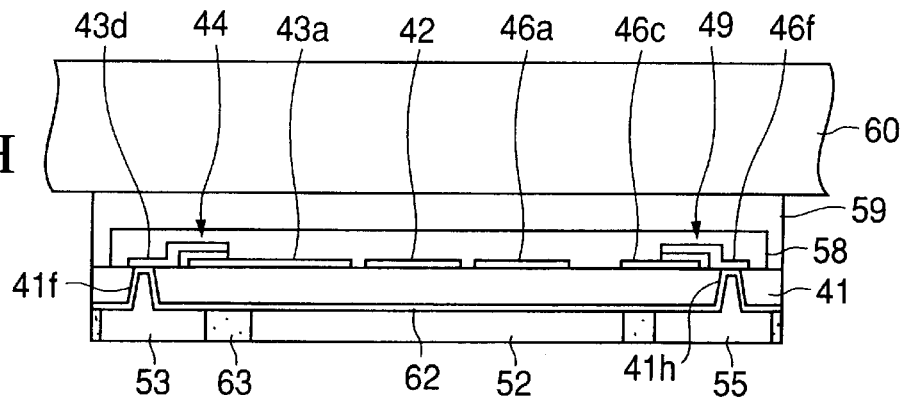

Then, as shown in FIG. 7G, resist 63 is coated on the gold film 62, and then openings 63a are formed in the ground area, the input/output areas, and the bias area by exposing/developing the resist 63. Then, as shown in FIG. 7H, a gold film of several tens μm is formed in the openings 63a in the resist 63 by the electrolytic method using the gold film 62 as the electrode. Then, the gold film formed in the ground area is used as the grounding metal film 52, the gold film formed in the input area is used as the high frequency input terminal 53, the gold film formed in the output area is used as the high frequency output terminal 55, and the gold films formed in the bias areas on the input side and the output side are used as the first and second bias terminals 54, 56 respectively.

Figure 7I:
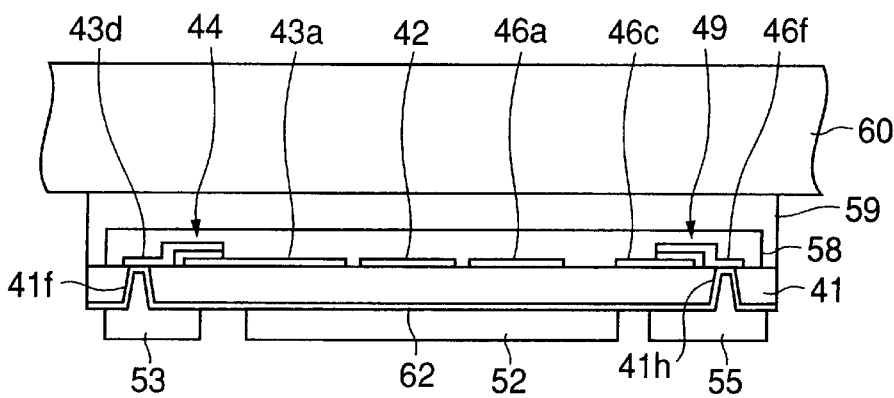
Figure 7J:
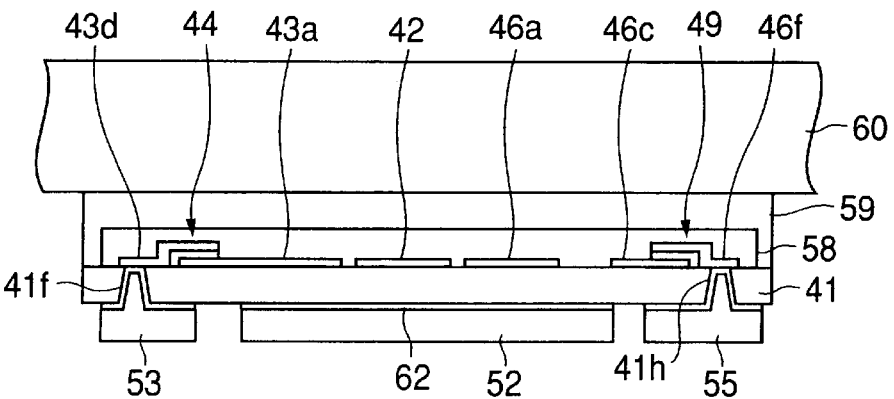

Then, as shown in FIG. 7I, the resist 63 is removed. Then, as shown in FIG. 7J, when the gold film 62 is etched while the grounding metal film 52, the high frequency input terminal 53, the high frequency output terminal 55, and the first and second bias terminals 54, 56 as a mask, the grounding metal film 52, the high frequency input terminal 53, the high frequency output terminal 55, and the first and second bias terminals 54, 56 are separated.

Since the chip-like GaAs substrate 41 is still pasted onto the supporting substrate 60 in this state, the GaAs substrate 41 is ready to handle. Thus, the electrical characteristics of the elements and the circuits on the first surface side can be measured by touching the grounding metal film 52, the high frequency input terminal 53, the high frequency output terminal 55, the first and second bias terminals 54, 56, etc. with a measuring terminal such as a probe, and thus it can be decided whether the electrical characteristics are good or bad.

Figure 7K:
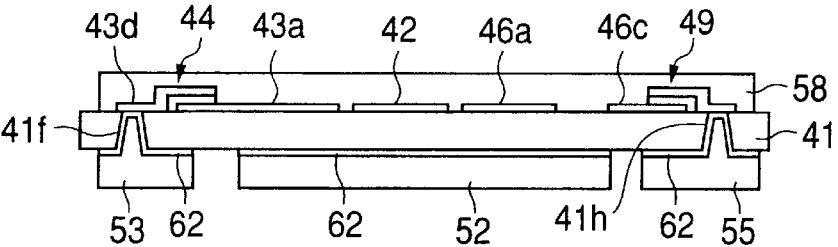

Then, as shown in FIG. 7K, when the adhesive agent 59 is removed with the solvent, the supporting substrate 60 is easily released from the GaAs substrate 41.

According to the above steps, the formation of the MMIC shown in FIGS. 5A and 5B is completed.

(Third Embodiment)

A structure that will be explained hereunder may be employed as the capacitors used in the MMIC in the first and second embodiments.

Figure 8:
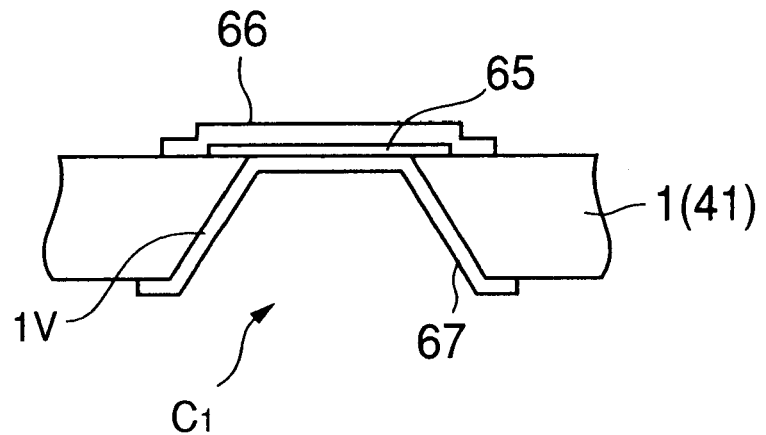
FIG. 8 is a sectional view showing a first capacitor of the MMIC according to a third embodiment of the present invention.

FIG. 8 is a sectional view showing a first example of a capacitor of the MMIC according to a third embodiment of the present invention.

In FIG. 8, a dielectric film 65 made of silicon oxide, silicon nitride oxide, silicon nitride, or the like and a first electrode 66 formed on the dielectric film 65 are formed on the first surface of the GaAs substrate 1(41).

Also, a tapered hole 1v whose diameter is expanded toward the second surface side is formed in the GaAs substrate 1 under the dielectric film 65. A second electrode 67 that is connected to a surface of the dielectric film 65 is formed in the hole 1v. The second electrode 67 is connected to the wiring, the grounding metal film, the input terminal, the output terminal, or the bias terminal on the second surface of the GaAs substrate 1(41).

A capacitor $C_1$ is composed of the first electrode 66, the dielectric film 65, and the second electrode 67.

Figure 9:
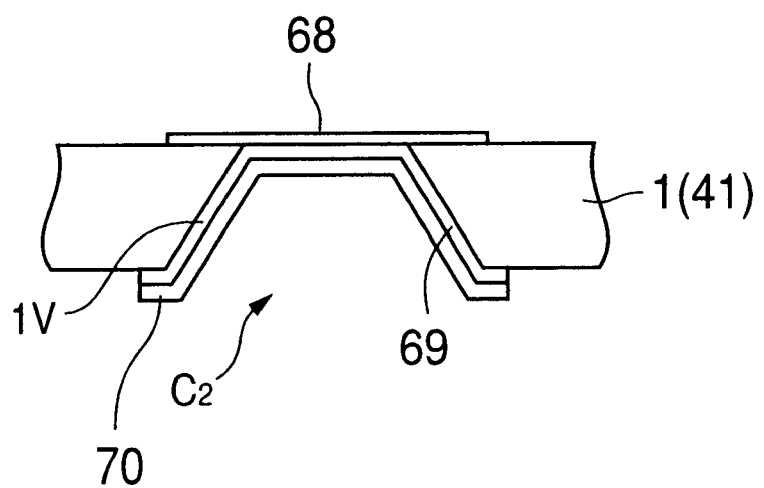
FIG. 9 is a sectional view showing a second capacitor of the MMIC according to the third embodiment of the present invention.

FIG. 9 is a sectional view showing a second example of a capacitor of the MMIC according to the third embodiment of the present invention.

In FIG. 9, a first electrode 68 is formed on the first surface of the GaAs substrate 1(41). The tapered hole 1v whose diameter is expanded toward the second surface side is formed in the GaAs substrate 1 under the dielectric film 68. A dielectric film 69 made of silicon oxide, silicon nitride oxide, silicon nitride, or the like and a first electrode 66 formed on the dielectric film 65 is formed on an inner surface of the hole 1v and its periphery of the second surface, and then a second electrode 70 is formed on the dielectric film 69. The second electrode 70 is connected to the wiring, the grounding metal film, the input terminal, the output terminal, or the bias terminal on the second surface of the GaAs substrate 1(41).

A capacitor $C_2$ is composed of the first electrode 68, the dielectric film 69, and the second electrode 70.

The first electrodes 66, 68 are formed of the metal film constituting the wiring in the first or second embodiment or the metal such as gold, platinum, or the like. Also, the second electrodes 67, 70 are formed of the same metal as the first electrodes 66, 68.

The second electrodes 67, 70 constituting the capacitors $C_1$, $C_2$ shown in FIGS. 8 and 9 respectively are formed in the hole 1v.

Accordingly, in case the first electrodes of the capacitors are arranged on the first surface and the second electrodes are extracted to the second surface side, the conductive films formed in the holes 1v are used as the second electrodes 67, 70 of the capacitors $C_1$, $C_2$ as they are. Therefore, there is no necessity that the second electrodes 67, 70 of the capacitors $C_1$, $C_2$ should be formed on the first surface side, as shown in FIG. 3A and FIG. 5A. In addition, the capacitors $C_1$, $C_2$ and the holes 1v under the capacitors can be formed to overlap with the forming areas of the dielectric films 65, 69. Therefore, there is no necessity that the second electrodes of the capacitors should be formed to protrude from the dielectric film, as shown in FIG. 3A and FIG. 5A, and the extension of the capacitors from the first surface to the second surface can be executed in the thickness direction of the substrate, and thus the area can be reduced. As a result, the margin of the circuit design can be enhanced much more and the higher performance can be achieved.

In this case, in FIG. 8 and FIG. 9, the first electrodes 66, 68 are formed on the first surface of the GaAs substrate 1(41) and the second electrodes 67, 70 are formed on the second surface and in the holes 1v. Conversely the structure in which the first electrodes 66, 68 are formed on the second surface and the second electrodes 67, 70 are formed on the first surface and in the holes 1v may be employed.

(Fourth Embodiment)

In the first and second embodiments, the holes are formed in the compound semiconductor substrate to connect the contact pads on the first surface of the compound semiconductor substrate and the contact pads or the terminals on the second surface. But a structure shown in FIGS. 10A and 10B may be employed in place of the holes.

Figure 10A:
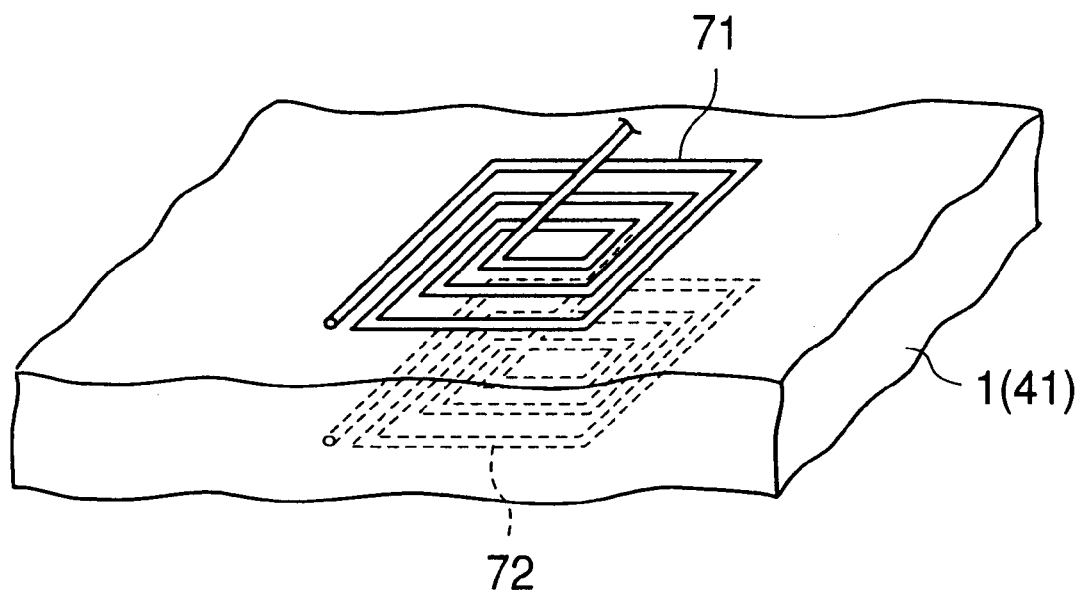
FIG. 10A is a perspective view showing a connection structure between circuits on the first surface and the second surface of the MMIC according to a fourth embodiment of the present invention.
Figure 10B:
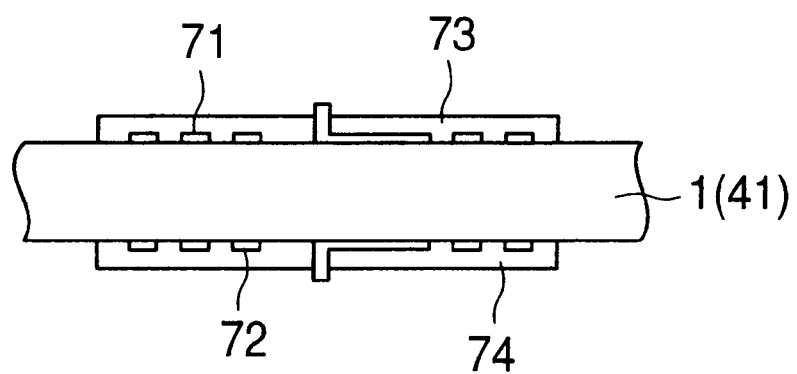
FIG. 10B is a sectional view showing the connection structure shown in FIG. 10A.

In FIGS. 10A and 10B, at the connection portion between the circuits on the first surface and the circuits on the second surface of the GaAs substrate 1(41) that has a thickness of more than 25 μm, for example, a first spiral coil 71 is formed on the first surface side and a second spiral coil 72 is formed on the second surface side, so that the first coil 71 and the second coil 72 are opposed mutually to put the GaAs substrate 1 therebetween. The first coil 71 is connected to the signal wirings and the capacitors on the first surface shown in the first or second embodiment. Also, the second coil 72 is connected to the signal capacitors and the terminals on the second surface shown in the first or second embodiment. Inner end portions of the first and second coils 71, 72 are extracted to the outside to pass through over insulating films 73, 74 formed on the first and second coils 71, 72. An electric signal is converted into a magnetic signal by the first coil 71, and then the magnetic signal is transmitted to the second coil 72. Then, the magnetic signal is converted into the electric signal by the induced current in the second coil 72, and then the electric signal is transmitted to the contact pads, the wirings, etc. on the second surface side.

Although not shown in FIGS. 10A and 10B, the same structure as the first embodiment is employed except the circuit connection structure between the first surface and the second surface of the GaAs substrate 1.

As described above, according to the structure in which the signals are transmitted via the first and second coils 71, 72, the necessity that a part or all of holes should be formed in the GaAs substrate 1 can be eliminated. Therefore, such structure is effective when the large mechanical strength of the GaAs substrate 1 must be maintained. Also, the margin of the circuit design can be enhanced by providing the first and second coils 71, 72 instead of the holes and thus the higher performance can be attained.

Figure 11:
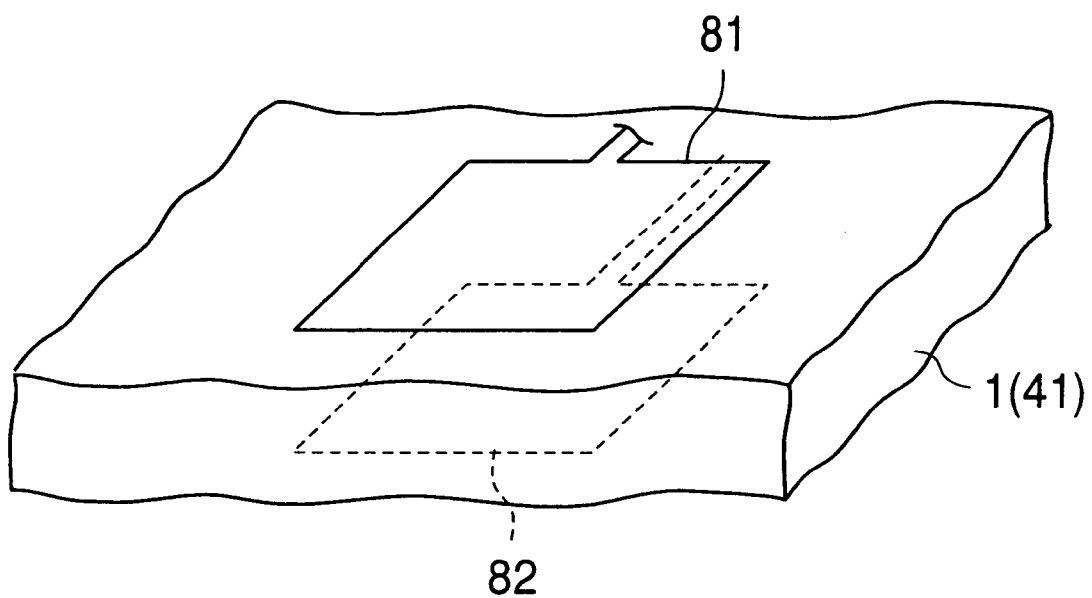
FIG. 11 is a perspective view showing another connection structure between circuits on the first surface and the second surface of the MMIC according to the fourth embodiment of the present invention.

In this case, as shown in FIG. 11, the capacitive coupling may be employed by forming first and second electrodes 81, 82 in place of the first and second coils 71, 72.

As described above, according to the present invention, the active elements are formed on the first surface of the semiconductor substrate and then the signal connection of the active elements is executed only by the terminals formed on the second surface of the semiconductor substrate. Therefore, the connection to the external circuits via the wires can be omitted by connecting the terminals to the wirings on the wiring substrate, and thus variations in the inductance component and the resistance component of the signal system can be suppressed.

Also, a part of the capacitors that are connected to the active elements is formed in the holes formed in the semiconductor substrate. Therefore, the extension of the electrodes of the capacitors from the first surface to the second surface can be executed in the thickness direction of the substrate, so that the area in circuit design can be reduced and also the margin of the circuit design can be enhanced.

What is claimed is:

1. A compound semiconductor device comprising:
   an active element formed on a first surface of a compound semiconductor substrate;
   a first hole formed in the compound semiconductor substrate;
   an input signal terminal formed on a second surface of the compound semiconductor substrate and connected to the active element through the first hole;
   a second hole formed in the compound semiconductor substrate;
   an output signal terminal formed on the second surface of the compound semiconductor substrate and connects to the active element through the second hole;
   a third hole formed in the compound semiconductor substrate; and
   a grounding conductive film formed on the second surface of the compound semiconductor substrate between the input signal terminal and the output signal terminal and connected to the active element through the third hole.

2. A compound semiconductor device according to claim 1, wherein a power supply connection bias terminal connected to the active element is formed on the first surface.

3. A compound semiconductor device according to claim 1, further comprising:
   a fourth hole formed in the compound semiconductor substrate;
   a power supply connection bias terminal formed on the second surface of the compound semiconductor substrate and connected to the active element through the fourth hole.

4. A compound semiconductor device according to claim 1, further comprising:
   a fifth hole formed in the compound semiconductor substrate; and
   a passive element formed on the second surface of the compound semiconductor substrate and connected to the active element via the fifth hole.

5. A compound semiconductor device according to claim 1, wherein the active element is one of HEMT, MESFET, and MISFET.

6. A compound semiconductor device according to claim 4, wherein the passive element is a capacitor.

7. A compound semiconductor device comprising:
   an active element formed on a first surface of a compound semiconductor substrate;
   a first electrode of a capacitor formed on the first surface of the compound semiconductor substrate and connected to the active element;
   a hole formed in the compound semiconductor substrate under the first electrode;
   an externally connecting terminal formed on a second surface of the compound semiconductor substrate;
   a second electrode of the capacitor formed in the hole and connected to the externally connecting terminal; and
   a dielectric film of the capacitor formed between the first electrode and the second electrode.

8. A compound semiconductor device according to claim 7, wherein the dielectric film is formed on the first surface.

9. A compound semiconductor device according to claim 7, wherein the dielectric film is formed in the hole.

10. A compound semiconductor device according to claim 7, wherein the active element is one of HEMT, MESFET, and MISFET.

11. A compound semiconductor device comprising:
    an active element formed only on a first surface of a compound semiconductor substrate;
    a signal wiring formed on the first surface and connected to the active element;
    a first coil formed on the first surface and connected to the signal wiring;
    a second coil formed on a second surface of the compound semiconductor substrate and opposed to the first coil to put the compound semiconductor substrate between them; and
    a signal terminal formed on the second surface of the compound semiconductor substrate and connected to the second coil.

12. A compound semiconductor device according to claim 11, wherein the active element is one of HEMT, MESFET, and MISFET.

13. A compound semiconductor device comprising:

an active element formed only on a first surface of a compound semiconductor substrate;

a signal wiring formed on the first surface and connected to the active element;

a first electrode formed on the first surface and connected to the signal wiring;

a second electrode formed on a second surface of the compound semiconductor substrate and capacitive-coupled with the first electrode to put the compound semiconductor substrate between them; and a signal terminal formed on the second surface of the compound semiconductor substrate and connected to the second electrode.

14. A compound semiconductor device according to claim 13, wherein the active element is one of HEMT, MESFET, and MISFET.

* * * * *